(12) United States Patent
Kautz et al.

(10) Patent No.: US 7,395,173 B2
(45) Date of Patent: Jul. 1, 2008

(54) TEMPERATURE SENSING DEVICE

(75) Inventors: Thomas O. Kautz, Mequon, WI (US);
Dominic Ticali, Franklin, WI (US);
Robert R. Freimuth, II, Greenfield, WI (US)

(73) Assignee: Johnson Controls Technology Company, Holland, MI (US)

( * ) Notice: Subject to any disclaimer, the term of this patent is extended or adjusted under 35 U.S.C. 154(b) by 170 days.

(21) Appl. No.: 11/241,846

(22) Filed: Sep. 30, 2005

(65) Prior Publication Data
US 2006/0074586 A1  Apr. 6, 2006

Related U.S. Application Data

(63) Continuation-in-part of application No. 10/801,313, filed on Mar. 16, 2004, now abandoned.

(51) Int. Cl.
*G01K 13/00* (2006.01)
*G06F 15/00* (2006.01)

(52) U.S. Cl. .............. 702/130; 702/132; 702/133; 702/136; 374/124

(58) Field of Classification Search ......... 702/130–136, 702/182–185, 188; 73/23.25; 374/124, 134, 374/164; 600/549; 264/40.6; 219/627
See application file for complete search history.

(56) References Cited

U.S. PATENT DOCUMENTS

| | | | |
|---|---|---|---|
| 5,055,245 A * | 10/1991 | Hisatomi et al. ........... 264/40.6 |
| 5,216,625 A * | 6/1993 | Rall ............................ 702/134 |
| 5,448,038 A * | 9/1995 | Kim ............................ 219/627 |
| 5,803,357 A | 9/1998 | Lakin |
| 6,220,750 B1 * | 4/2001 | Palti ........................... 374/164 |
| 6,280,397 B1 | 8/2001 | Yarden et al. |
| 6,695,471 B2 | 2/2004 | Hashimoto et al. |
| 6,929,611 B2 * | 8/2005 | Koch ........................... 600/549 |

(Continued)

FOREIGN PATENT DOCUMENTS

DE    19800753 A1    7/1999

(Continued)

OTHER PUBLICATIONS

German Patent Search Report, date of mailing Mar. 15, 2006, 3 pages.

(Continued)

*Primary Examiner*—Jeffrey R. West
*Assistant Examiner*—Phuong Huynh
(74) *Attorney, Agent, or Firm*—Foley & Lardner LLP (57) ABSTRACT

The present invention relates to a temperature sensing device with a first temperature sensor mounted to a housing at a first location proximate a first surface of the housing. The first temperature sensor senses a first temperature while a second temperature sensor senses a second temperature. A processor circuit is coupled to the first and second temperature sensors and a mounting device is coupled to either the housing or the processor circuit. The mounting device mounts the second temperature sensor at a second location proximate a second surface of the housing which is spaced apart from the first surface. The processor circuit is configured to estimate a third temperature based on the first and second temperatures and a distance between the first and second locations which is an estimate of a temperature at a third location.

14 Claims, 4 Drawing Sheets

U.S. PATENT DOCUMENTS

2004/0186333 A1* 9/2004 Lattner ..................... 585/639

FOREIGN PATENT DOCUMENTS

| DE | 10139705 A1 | 4/2003 |
| EP | 0756161 A1 | 1/1997 |
| GB | 2131175 A | 6/1984 |

OTHER PUBLICATIONS

Siemens, "FR-H1/T1 Room sensor for humidity and temperature", Siemens Building Technologies Landis & Staefa Division, © 1998 Siemens Building Technologies Ltd., (4 pgs.), (1 color pg.) (5 total pgs.).

* cited by examiner

TEMPERATURE SENSING DEVICE

CROSS-REFERENCE TO RELATED PATENT APPLICATIONS

This application is a continuation-in-part of U.S. patent application Ser. No. 10/801,313 entitled "Temperature Sensing Device" filed Mar. 16, 2004, the entire contents of which are incorporated herein by reference.

BACKGROUND OF THE INVENTION

The present description relates generally to temperature sensing devices such as thermostats, etc. More specifically, the present description relates to mounting devices for sensors in temperature sensing devices.

Climate control systems, such as heating, ventilating, and air conditioning (HVAC) systems, typically include one or more thermostats to monitor, for example, an ambient air temperature within a particular room or space within a building to provide feedback as to whether the air temperature of the room needs to be adjusted to satisfy a predetermined set point. The thermostat is typically configured such that a temperature sensor is housed within an enclosure to sense the temperature of the air passing over, through, or in contact with the enclosure. The climate control system may then compare this air temperature to the predetermined set point to determine if the air temperature of the room needs to be adjusted to satisfy the predetermined setpoint. Typically, the temperature sensor is interconnected with a processor circuit to accomplish this function. The temperature sensor can be either indirectly coupled or directly secured to the processor circuit which includes a plurality of interconnecting members (or conductive wires). The processor circuit is coupled to the housing and is enclosed therein.

For convenience, the thermostat may be mounted to a wall or other structure within a space or room. However, when the thermostat is mounted to the surface of an outside wall or another location where the wall surface is significantly warmer or colder than the air temperature of the space or room, there may be substantial differences between the air temperature measured by the thermostat and the actual ambient air temperature of the space or room. Further, air flow through the thermostat may be minimal due to a low profile enclosure designed such that the thermostat is minimally noticeable and does not project undesirably from the wall or other mounting location. Under these conditions, the climate control system may perform inefficiently because the temperature measured by the thermostat may not be the ambient air temperature of the room, but rather a temperature somewhere between the air temperature of the room and the wall surface temperature. Previous attempts to solve this problem include affixing the sensor against a surface of the temperature sensing device housing opposite the mounting structure with an adhesive. This surface is generally planar or flat. In this arrangement extension of the sensor into the room or space is, however, limited by the dimensions of the housing which—in order to provide a low profile appearance—typically affords minimal area. Thus there is need for a device for mounting a sensor within a temperature sensing device so that the temperature sensing device may compensate for mounting surface temperature effects.

SUMMARY OF THE INVENTION

According to a first exemplary embodiment, a temperature sensing device is provided having a housing and a first temperature sensor mounted to the housing at a first location proximate a first surface of the housing. The first temperature sensor is configured to sense a first temperature. A second temperature sensor is also provided which is configured to sense a second temperature. Further included with the present temperature sensing device is a processor circuit coupled to the first and second temperature sensors and a mounting device coupled to at least one of the housing or the processor circuit which is configured to mount the second temperature sensor at a second location proximate a second surface of the housing and spaced apart from the first surface. The processor circuit is configured to estimate a third temperature based on the first and second temperatures and a distance between the first and second locations. The third temperature is an estimate of a temperature at a third location and the distance between the first and third location is greater than the distance between the first and second locations.

According to another exemplary embodiment, a temperature sensing device with housing defining a protrusion is provided. Also included are a temperature sensor mounted with respect to the housing and configured to sense a temperature and a processor circuit which is coupled to the first temperature sensor. Further provided is a mounting device coupled to at least one of the housing and the processor circuit which is configured to mount the temperature sensor at a second location proximate the protrusion of the housing. The mounting device has a semi-annular configuration.

According to another exemplary embodiment, a processor circuit for a temperature sensing device having a plurality of sensors is provided. The processor circuit is configured in a manner to selectively interconnect the plurality of sensors. A mounting device which protrudes outward a first distance from the processor circuit is also included. At least one of the sensors in the plurality of sensors is coupled to the mounting device and spring biased with respect to the processor circuit by the mounting device. The mounting device is configured to interconnect at least two of the sensors in the plurality of sensors with the processor circuit.

According to another exemplary embodiment a temperature sensing device with housing defining a protrusion is provided. The sensor mounting device coupled to the processor circuit is configured to project one or more sensors into the protrusion in an effort to get an improved estimate of room temperature. The sensor mounting device is simply and securely connected to the processor board while still providing a sufficient thermal connection between the protrusion and the thermal sensor. The flexible circuit permits the processor board to be assembled and disassembled from the enclosure without the inconvenience or danger of damaging or severing the sensor leads.

DETAILED DESCRIPTION OF THE PREFERRED EMBODIMENTS

Figure 1:
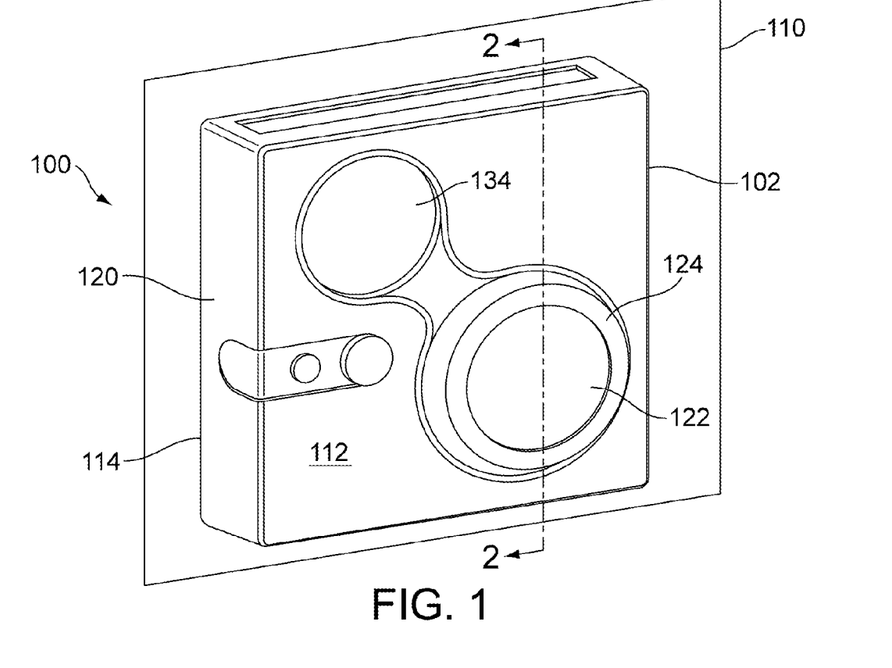
FIG. 1 is a perspective view of a temperature sensing device according to an exemplary embodiment.

FIG. 1 illustrates a temperature sensing device 100 according to an exemplary embodiment. Temperature sensing device 100 may be a thermostat, such as a wall-mounted electronic thermostat configured for use with a climate control system to measure the air temperature of a room or space. In other embodiments, temperature sensing device 100 may be adapted for use with other systems or locations. Temperature sensing device 100 includes a housing 102, temperature sensors 104 and 106, mounting device 136, and a processor circuit 108 (as shown in FIGS. 1-7). Temperature sensing device 100 may be generally used to sense a first temperature and a second temperature and to estimate a third temperature using the first temperature and the second temperature. More specifically, temperature sensing device 100 may be used to compensate for external temperature effects resulting from the location of temperature sensing device 100 by measuring a first temperature and a second temperature, and estimating the third temperature based on the first temperature and the second temperature.

Figure 2A:
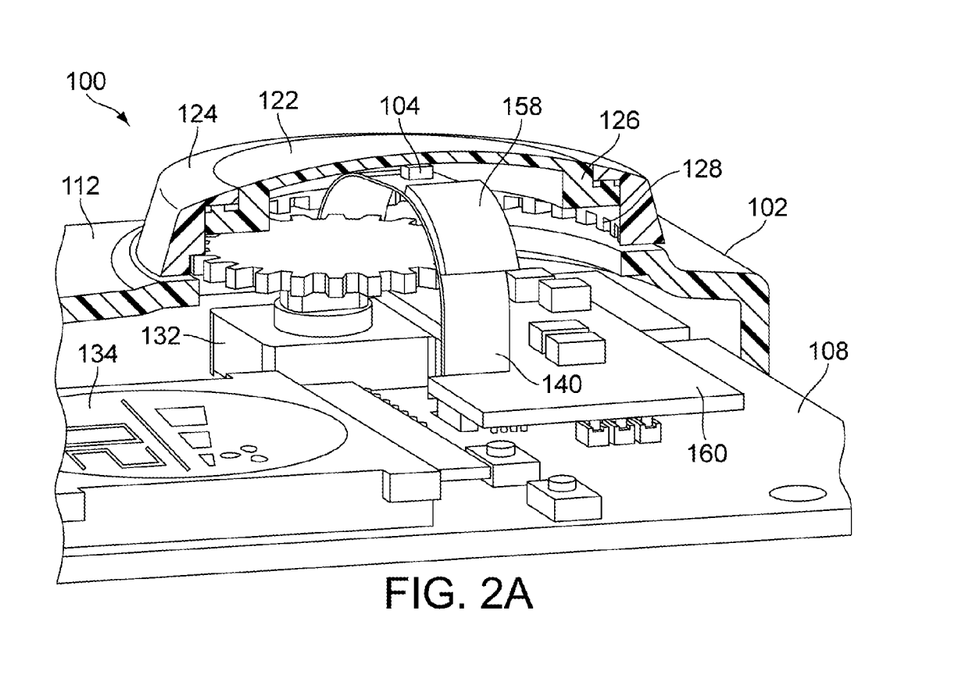
FIG. 2A is a perspective view of a temperature sensing device with housing partially cut away along line 2-2 of FIG. 1 according to an exemplary embodiment.
Figure 2B:
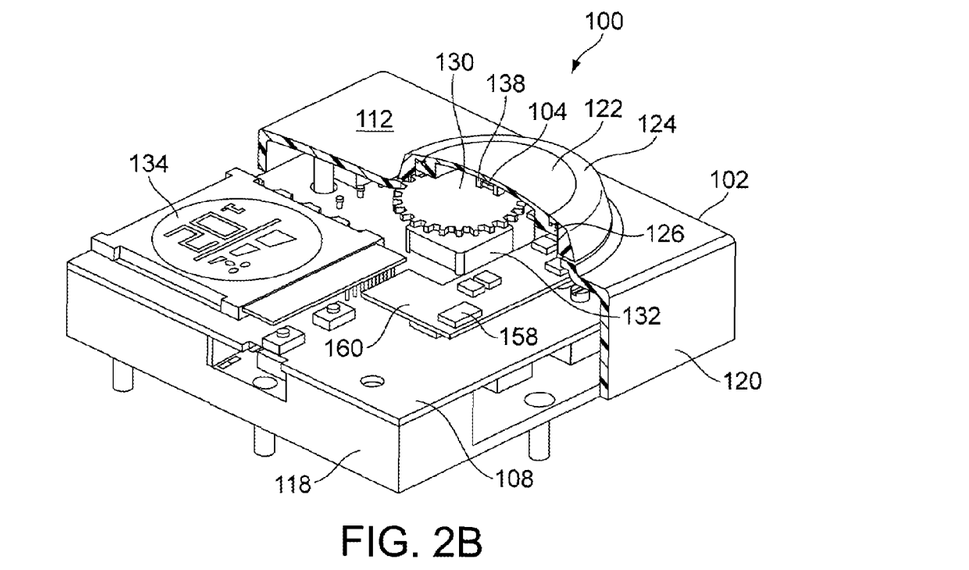
FIG. 2B is a perspective view of a temperature sensing device with housing partially cut away along line 2-2 of FIG. 1 and fastener according to an exemplary embodiment.

Housing 102, as illustrated in FIG. 1, is configured to provide a structure within which temperature sensors 104 and 106, and optionally processor circuit 108, may be mounted and enclosed, as shown in FIGS. 2A-B. In the illustrated exemplary embodiment, processor circuit 108 is shown as being enclosed within housing 102. In another embodiment, processor circuit 108 is located within another device or controller remotely located and/or external to housing 102. Housing 102 is made of a rigid material such as a hard plastic, metal or other material suitable to protect the internal components of housing 102. In one embodiment, portions of housing 102 may be made of a thermally conductive material such that at least one of the temperatures sensed by temperature sensors 104 and 106 may be sensed by conduction through housing 102. In another embodiment, the housing 102 is made of a material having low density so that in a similar manner to the highly conductive material at least one of the temperatures sensed by temperature sensors 104 and 106 may be rapidly sensed by conduction through housing 102. In yet another embodiment, housing 102 may include one or more openings or vents to facilitate the flow of air through the housing once the temperature sensing device has been mounted such that at least one of the temperatures sensed by temperature sensors 104 and 106 may be sensed by convection through housing 102.

Housing 102 is further configured to be mounted to a structure 110, as shown in FIG. 1. In the illustrated exemplary embodiment, housing 102 is configured to be mounted to the surface of structure 110, such as a building wall, ceiling, column, floor or other structure utilizing any suitable mounting hardware or other means of attachment. Housing 102 includes orifices in surface 114 to accommodate a variety of suitable mounting hardware. Structure 110 to which temperature sensing device 100 is mounted may be, for example, an exterior wall or other structure for which the temperature of the surface is different from, for example, the air temperature in the middle of the room or other area which includes or is exposed to the structure and in which temperature sensing device 100 is mounted.

Housing 102 may be any suitable size or shape depending on the particular application. However, in the illustrated exemplary embodiment surface 112 and surface 114 of housing 102 are spaced proximate to each other so as to provide a "low profile" appearance of housing 102. For example, in the illustrated embodiment, housing 102 is an essentially rectangular hollow protrusion with a low profile such that housing 102 does not significantly extend beyond the surface of structure 110 (e.g., a wall) to which it is mounted. In this embodiment, housing 102 is shaped such that it has surface 112 and surface 114 spaced apart from structure 110. In the illustrated embodiment shown in FIG. 2B, housing 102 is formed from a mounting base 118 and a mating cover 120 such that mounting base 118 includes structure 110 and mating cover 120 includes surface 112. In other embodiments, housing 102 may be formed from additional pieces, or may be a single piece.

Surface 114 is configured to be adjacent to a surface of a structure 110, such as a wall, to which housing 102 is mounted. Surface 114 is configured to be spaced slightly apart from the surface of structure 110 and exposed to a temperature at a distance from the surface of structure 110, such as the temperature of the air at a distance from the surface of a wall to which temperature sensing device 100 is mounted. Alternatively, surface 114 may abut the structure of surface 110. Preferably, surface 112 is spaced apart from surface 114 such that the distance between surface 114 and surface 112 is maximized while maintaining an overall low profile for temperature sensing device 100. For example, the embodiment shown in FIG. 1 includes a protrusion 122 (shown as a contoured dome) extending from mating cover 120 which is configured to maximize the spacing between surface 114 and surface 112 while maintaining an overall low profile of temperature sensing device 100. Protrusion 122 includes a annular shoulder 126 as shown in FIGS. 2A and 2B. Additional support may be added to protrusion 122 by a series of struts (not shown) extending between surface 112 of housing 102 and the contoured dome of protrusion 122. Protrusion 122 is composed of a thin polymer so to decrease the response time of any temperature sensor abutting protrusion. In one embodiment protrusion 122 is stationary with respect to housing 102 and an adjustable ring 124 (or dial as shown in FIGS. 1-2B) is coupled to protrusion 122. Ring 124 is annular and configured to rotate with respect to housing 102 when slidably coupled to annular shoulder 126 of protrusion 122. In other embodiments, protrusion 122 may be eliminated, such that mating cover 120 is substantially planar.

The inner diameter of ring 124 includes a series of gear teeth 128, as shown in FIG. 2A which are compatible with an adjustment gear 130. Adjustment gear 130 is coupled to a position sensor 132 such as potentiometer which is interconnected to the processor circuit. Rotation of position sensor 132 adjusts the temperature set point of temperature sensing device 100. In another embodiment, rotation of position sensor 132, via adjustable ring 124, adjusts the image displayed on a display screen 134. In the illustrated exemplary embodiment display screen 134 is an LCD display, however, it may be any other suitable display screen. Preferably, ring 124 and adjustment gear 130 are composed of a hard plastic or metal; however, the conductivity and/or density of the material in which the two are composed does not significantly impact the performance of temperature sensor 104. Therefore, ring 124 and adjustment gear 130 may be composed of a variety of materials without influencing the performance of temperature sensor 104. Additionally, position sensor 132 need not be a rotational position sensor; in another exemplary embodiment, position sensor 132 is responsive to longitudinal or transverse adjustments.

Temperature sensors 104 and 106 may be mounted within housing 102, as shown in FIGS. 2A-B, and may be any suitable temperature sensor. For example, in one embodiment, temperature sensors 104 and 106 may be resistance thermal detectors (RTDs). In another embodiment, temperature sensors 104 and 106 may be thermistors. In one embodiment temperature sensors 104 and 106 may be electrical or electronic devices that provide an analog output signal. In another embodiment, temperature sensors 104 and 106 may be electrical or electronic devices that provide a digital output signal. In the illustrated exemplary embodiment, temperature sensors 104 and 106 are configured to sense temperatures at different locations with respect to the surfaces 112, 114, 118 and 120 of housing 102. For example, in the illustrated embodiment as shown in FIG. 2A-B, temperature sensor 104 is mounted proximate to surface 112 and temperature sensor 106 is spaced apart from temperature sensor 104 and mounted proximate to surface 114. Each sensor (104 and 106) is mounted relative to housing 102 or mounting structure 110. Temperature sensor 104 is mounted to housing 102 at a first distance relative to housing 102 and the temperature sensor 106 is mounted to housing 102 at a second distance relative to the housing 102. Preferably, the spacing between temperature sensors 104 and 106 is the maximum possible spacing that housing 102 will permit.

Temperature sensor 104 may be configured to sense the temperature at or near the surface of structure 110 to which housing 102 is mounted, as surface 114 of housing 102 is typically adjacent structure 110. Temperature sensor 106 may be configured to sense the temperature of the air in which mating cover 120 and surface 112 are exposed. In another embodiment, temperature sensor 106 may be coupled directly to the mating cover 120 in order to position temperature sensor 106 as close as possible to the air in which mating cover 120 and surface 112 are exposed (i.e., as far as possible from structure 110 to which housing 102 is mounted. In another exemplary embodiment, temperature sensor 106 is configured to abut protrusion 122 in surface 112 of housing 102 and the temperature of protrusion 122 is sensed by temperature sensor 106 through conduction. In this embodiment, sensor 106 may be placed on the inner surface or outer surface of protrusion 122. In another embodiment, the temperatures sensed by temperature sensors 104 and 106 are sensed primarily by convection. In this embodiment, housing 102 may also include openings or vents to permit the flow of air through housing 102 and temperature sensor 106 may be mounted within protrusion 122 without abutting protrusion 122 of housing 102 such that it is spaced apart from temperature sensor 104 while being exposed to the flow of air, therefore the temperature of the air flowing through housing 102 is sensed by sensor 104.

While the illustrated embodiment shows both sensors 104 and 106 mounted within housing 102, other mounting locations are possible. For example, in one embodiment, temperature sensor 106 may be mounted outside housing 102. In another embodiment, temperature sensing device 106 may be mounted on an extension to housing 102 to increase the distance between temperature sensor 104 and 106. In yet another embodiment, temperature sensors 104 and 106 may be mounted in separate housings, so long as they are both in communication with processor circuit 108.

Processor circuit 108, as shown in FIGS. 2A-3 and 5-6, is coupled to temperature sensors 104 and 106 and may be any suitable processor circuit. Processor circuit 108 is configured to receive a temperature measurement from temperature sensor 104 and a temperature measurement from temperature sensor 106. In the illustrated embodiment, processor circuit 108 is shown as being coupled to (or interconnected with) temperature sensors 104 and 106 and mounted within housing 102. In another embodiment, processor circuit 108 is coupled to temperature sensors 104 and 106, but is located external to housing 102. Processor circuit 108 is also configured to use the temperature measurements from temperature sensors 104 and 106 to estimate a third temperature. For example, in one embodiment processor circuit 108 may be configured to estimate the temperature of an air mass in a room or other area in which temperature sensing device 100 is mounted using temperature measurements from temperature sensors 104 and 106. Because temperature sensing device 100 may be located on the boundary surface of the room air mass, neither temperature sensor 104 nor temperature sensor 106 may be sufficiently exposed to the actual temperature of the air mass. Additionally, temperature sensing device 100 may further be mounted to the surface of a structure 110, such as an exterior wall, such that it is exposed to various external or other temperature effects. Accordingly, in this embodiment processor circuit 108 may be configured to estimate the third temperature from the temperature measurements from temperature sensors 104 and 106 by compensating for the various external temperature effects due to the mounting location of temperature sensing device 100. The third temperature may be estimated from the temperature measurements from temperature sensors 104 and 106 in a number of ways. For example, in one embodiment, the third temperature is estimated using a predetermined extrapolation function which defines an approximate mathematical relationship between the temperature measurements from temperature sensors 104 and 106 and the third temperature to be estimated. In other embodiments, methods other than mathematical extrapolation may be used. The details of the processor circuit 108 configured to estimate the third temperature based on the first and second temperatures is described in detail in commonly assigned U.S. patent application Ser. No. 10/801,313.

Figure 3:
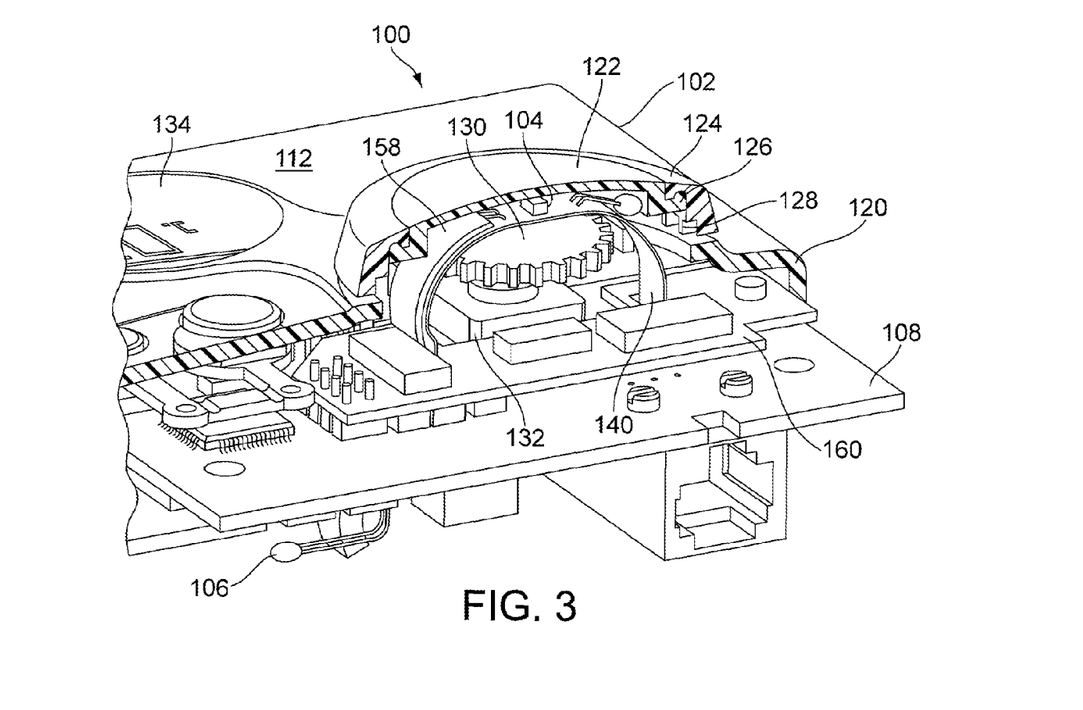
FIG. 3 is a perspective view of a temperature sensing device with housing partially cut away according to an exemplary embodiment.
Figure 4:
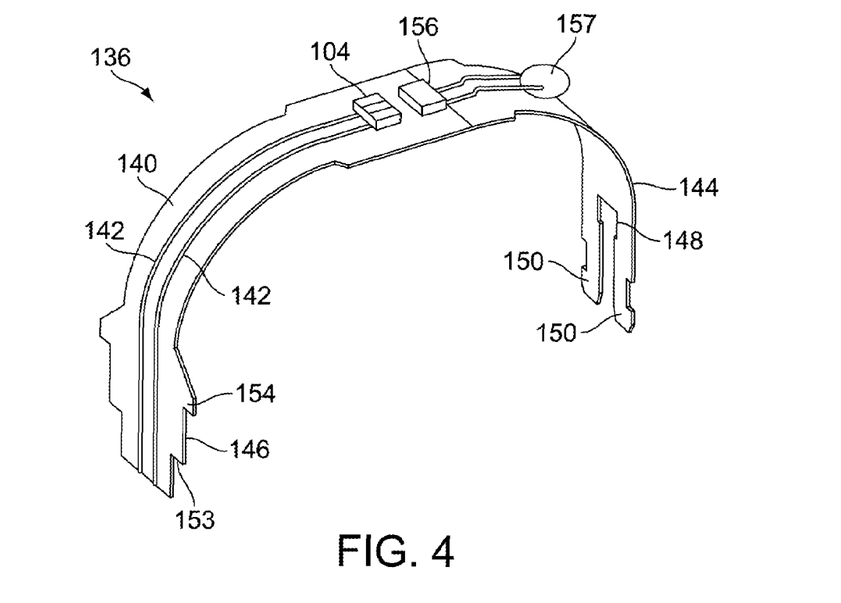
FIG. 4 is a perspective view of the flexible circuit for a temperature sensing device according to an exemplary embodiment.

In one exemplary embodiment (as shown in FIG. 3) mounting device 136 is secured to housing 102. In this embodiment fastener 138 is configured to couple any one of temperature sensors 104, 106 to protrusion 122 of housing 102. Interconnecting members 142 are attached to surface 112 of housing 102 and extend to processor circuit 108. In another exemplary embodiment, processor circuit 108 includes a position sensor 132 which is attached to an adjustment gear 130 and mounting device 136 is configured to avoid interference with adjustment gear 130 and the components of position sensor 132. In another exemplary embodiment as shown in FIG. 4, mounting device 136 is a flexible circuit 140 which may be coupled directly or indirectly onto processor circuit 108. Flexible circuit 140 includes interconnecting members 142 extending between temperature sensor 104 and an end of flexible circuit. When flexible circuit 140 is detached from processor circuit 108 (or in "free state") it extends flat. When coupled to processor circuit 108, flexible circuit 140 acts as a leaf spring thereby biasing temperature sensor 104 with respect to processor circuit 108. Flexible circuit 140 is configured to protrude outward from processor circuit 108 as much as possible without exceeding the space provided by protrusion 122 or surface 112 of housing 102. In such case, when enclosed by housing 102, temperature sensor 104 may abut protrusion 122 or surface 112 of housing. In this embodiment sensor 104 is configured to measure the temperature of protrusion 122 or surface 112 of housing 102 through conduction. Since flexible circuit 140 is slightly deformable with respect to processor circuit 108 the assembly tolerances for temperature sensing device 100 may be more lenient than an arrangement having a non-deformable mounting device 136, thereby potentially reducing the manufacturing costs for the assembled temperature sensing device 100. Flexible circuit 140 may be composed of thin, flexible, nonconductive plastic substrate such as polyimide, epoxy laminate etc. While the illustrated embodiments show temperature sensor 104 attached to mounting device 136 any sensor disclosed herein may be alternatively coupled to mounting device.

Figure 5:
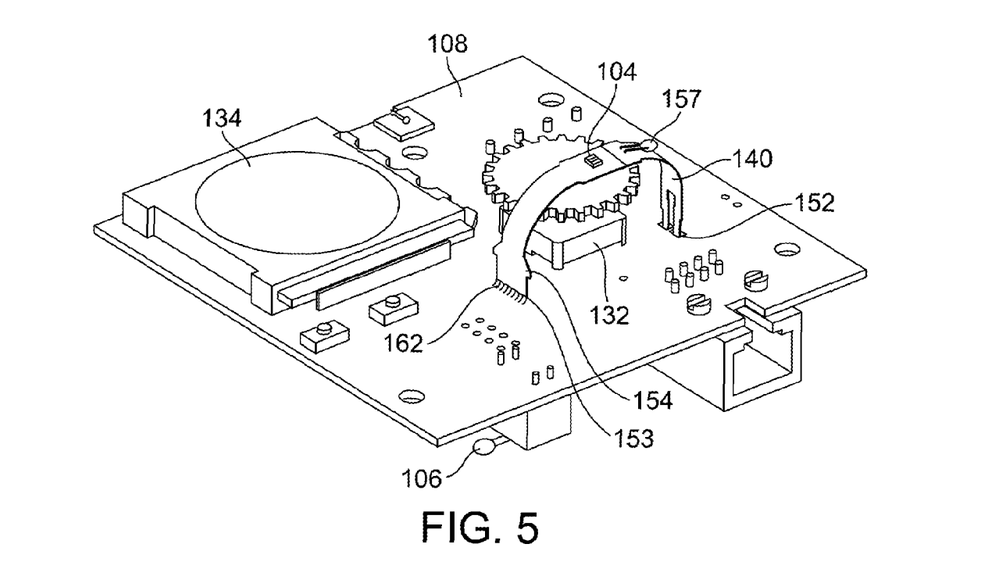
FIG. 5 is a perspective view of a processor circuit isolated from the housing of a temperature sensing device according to an exemplary embodiment.

In another embodiment, flexible circuit 140 has an semi-annular shape or configuration when coupled to processor circuit 108, as shown in FIGS. 3-5. The semi-annular shape enables interconnecting members 142 to avoid interference with adjustment gear 130 of position sensor 132. Flexible circuit 140 is sufficiently long so as to avoid interference with adjustment gear 130 when temperature sensor 104 abuts either protrusion 122 or surface 112 of housing 102.

Flexible circuit 140 includes end 144 and end 146. End 144 of flexible circuit 140 is notched (as shown in FIG. 4) so that end 144 may couple to a complementary slot in processor circuit 108. Notch pattern 148 is configured to create barbed members 150 extendable through slot 152 in primary circuit board 108 for mechanical support and retention. End 146 of flexible circuit 140 includes two shoulder portions 153,154 (or tab inserts). Shoulder portion 153 fits into processor circuit 108 and shoulder portion 154 fits into niche 162 in module 160, as shown in FIG. 8. Niche 162 includes a series of small orifices having variable sizes; the intersection of the inner surfaces of the orifices creates a jagged profile for the interior surface of niche 162 which is configured in a manner to fit end 146 of flexible circuit 140 within the series of orifices. Moreover, since niche 162 is formed from a series of orifices, as opposed to cutting operations typically used to produce a narrow straight-edged interior surface, the manufacturing costs can be significantly reduced. Shoulder portion 154 includes interconnecting members 142 configured to extend to through end 144 and terminate in primary circuit board 108 when mounting device 136 is connected thereto.

Interconnecting members 142 may be composed of any conductive material suitable for use in conventional processors. Interconnecting members 142 are configured for soldering of sensors and termination to processor circuit 108. According to an exemplary embodiment, interconnecting members 142 are copper traces. The response time of temperature sensor 104 is inversely related to the mass of flexible circuit 140. To decrease the response time, one embodiment includes interconnecting members 142 of a suitably reduced diameter.

In addition to sensor 104 mounting device 136 may include a plurality of sensors (104, 156, 157 and/or 158) as shown in FIG. 4. In one embodiment, mounting device 136 includes a third sensor 156 and/or 157. Third sensor 156 and/or 157 is configured to assess an additional temperature reading and enables temperature sensing device 100 to be simultaneously compatible with an additional processor circuit. For example, if temperature sensor 104 is configured to be compatible with processor circuit 108 third sensor 156 and/or 157 may be configured to be compatible with an external processor circuit (not shown). Any sensor which provides the desired level of resistance may be utilized with temperature sensing device 100, including a PT1000 resistive output or a thermistor resistive output. A fourth sensor 158 may also be coupled to mounting device 136. In one embodiment, fourth sensor 158 is a humidity sensor configured to assess the humidity of the air circulating through housing 102 of temperature sensing device 100. Fourth sensor 158 may alternatively be mounted directly to processor circuit 108 or to a module coupled thereto.

Figure 6:
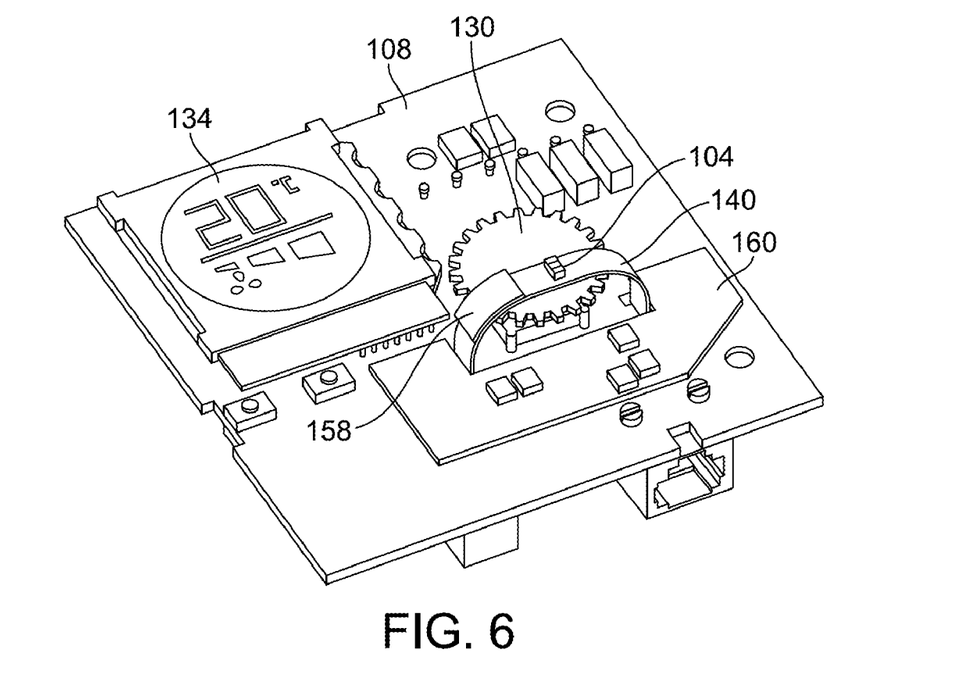
FIG. 6 is a perspective view of a processor circuit with module isolated from the housing of a temperature sensing device according to an exemplary embodiment.
Figure 7:
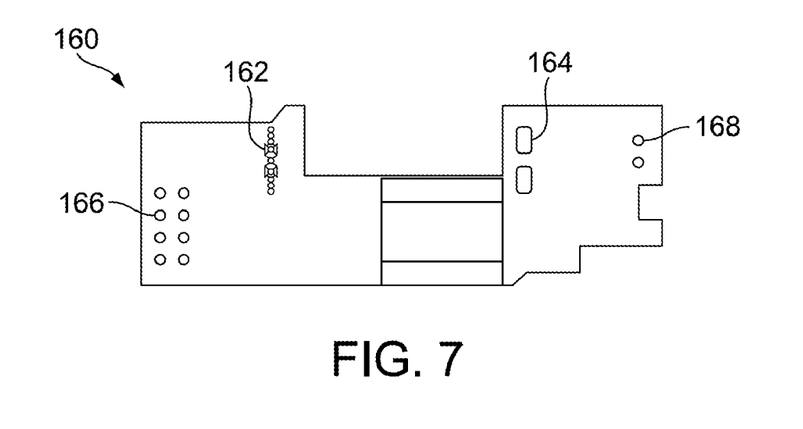
FIG. 7 is a top view of a module isolated from temperature sensing device according to an exemplary embodiment.

In another embodiment, processor circuit 108 includes a module 160, as shown in FIG. 6. Module 160 may include sensor 158 for sensing the humidity, temperature, etc. In the illustrated embodiment module 160 includes a RH module with interconnecting members 166 and 168 extending from module 160 to processor circuit 108. Mounting device 136 may be indirectly coupled to processor circuit 108 through module 160 or directly coupled to processor circuit 108. In one embodiment, mounting device 136 is a flexible circuit 140 configured to couple to module 160. Flexible circuit 140 may include interconnecting members 142 extending between a plurality of sensors (158 and any others) mounted thereto and module 160 or processor circuit 108. Module 160 attaches to processor circuit 108 through soldering connectors 166 and strut 168. Flexible circuit 140 may connect to module 160 at end 146 by insertion into niche 162 so that shoulder 154 abuts module 160; additionally, end 144 is connectable by insertion of barbed members 150 into slots 164.

It should be understood that the construction and arrangement of the elements of the temperature sensing device in the exemplary embodiments are illustrative only. Although only a few embodiments of the present invention have been described in detail in this disclosure, many modifications are possible without materially departing from the novel teachings and advantages of the subject matter recited in the claims. For example, the temperature sensing device may be adapted for use in other systems or locations, may incorporate additional temperature sensors or other inputs, or may include other variables or factors in the extrapolation function. Accordingly, all such modifications are intended to be included within the scope of the present invention as defined in the appended claims. Unless specifically otherwise noted, the claims reciting a single particular element also encompass a plurality of such particular elements. Moreover, claims reciting that one element is coupled to another should be interpreted to mean that the elements are selectively coupled to each other and may be uncoupled or disconnected at any point. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and/or omissions may be made in the design, operating conditions and arrangement of the preferred and other exemplary embodiments without departing from the spirit of the present invention as expressed in the appended claims.

What is claimed is:

1. A temperature sensing device, comprising:
   a housing;
   a first temperature sensor mounted within the housing at a first location near a first surface of the housing and configured to sense a first temperature;
   a second temperature sensor configured to sense a second temperature;
   a processor circuit coupled to the first and second temperature sensors; and
   a mounting device coupled to at least one of the housing and the processor circuit configured to mount the second temperature sensor at a second location near a second surface of the housing and spaced apart from the first surface;

wherein the processor circuit is configured to estimate a third temperature based on the first and second temperatures and a distance between the first and second locations, wherein the third temperature is an estimate of a temperature at a third location, and wherein the distance between the first and third location is greater than the distance between the first and second locations.

2. The temperature sensing device of claim 1, wherein the mounting device is a fastener configured to couple the second temperature sensor to the second surface of the housing.

3. The temperature sensing device of claim 1, wherein the mounting device is a flexible circuit; and wherein the second temperature sensor is spring biased with respect to the processor circuit by the mounting device.

4. The temperature sensing device of claim 3, wherein the second temperature sensor abuts the housing.

5. The temperature sensing device of claim 3, wherein the processor circuit is coupled to the housing and wherein the mounting device is coupled to the processor circuit.

6. The temperature sensing device of claim 5, wherein the mounting device is configured to protrude towards the second surface of the housing.

7. The temperature sensing device of claim 5, wherein the second surface of the housing includes a protrusion.

8. The temperature sensing device of claim 5, wherein the mounting device has a semi-annular configuration.

9. The temperature sensing device of claim 5, wherein the mounting device has a first end and wherein the first end of the mounting device is notched.

10. The temperature sensing device of claim 9, wherein the mounting device has a second end; and wherein the processor circuit includes a series of orifices configured in a manner to fit the second end of the mounting device within the series of orifices.

11. The temperature sensing device of claim 9, wherein the processor circuit includes a plurality of modules mounted with respect to the processor circuit and wherein the mounting device is configured to couple to at least one of the plurality of modules.

12. The temperature sensing device of claim 9, wherein the mounting device has a second end and wherein the second end of the mounting device includes a shoulder portion configured to secure the mounting device to the processor circuit and further configured with interconnecting members extending between the first temperature sensor and the shoulder portion.

13. The temperature sensing device of claim 3, further comprising:
a third sensor coupled to the mounting device and interconnected to at least one of the first temperature sensor, the second temperature sensor and the processor circuit through interconnecting members extending there between; and wherein the third sensor is configured to indicate a fourth temperature measurement.

14. The temperature sensing device of claim 13, further comprising:
a fourth sensor coupled to the mounting device and interconnected to at least one of the first temperature sensor, the second temperature sensor and the processor circuit through interconnecting members extending there between; and wherein the fourth sensor is a humidity sensor.

* * * * *